United States Patent [19]
Choi et al.

[11] Patent Number: 5,900,056
[45] Date of Patent: May 4, 1999

[54] METHOD FOR GROWING EPITAXIAL LAYERS OF III-V COMPOUND SEMICONDUCTORS

[75] Inventors: Sung-Woo Choi; Jong-Hyeob Baek; Bun Lee, all of Daejeon, Rep. of Korea

[73] Assignee: Electronics and Telecommunications Research Institute, Daeieon, Rep. of Korea

[21] Appl. No.: 08/769,242

[22] Filed: Dec. 18, 1996

[30] Foreign Application Priority Data

Dec. 18, 1995 [KR] Rep. of Korea ..................... 95-51470

[51] Int. Cl.⁶ .................................................. C30B 25/14
[52] U.S. Cl. .............................. 117/104; 117/89; 117/105
[58] Field of Search ................................. 117/11, 13, 37, 117/41, 43, 44, 47, 50, 51, 89, 104, 904, 905, 105

[56] References Cited

U.S. PATENT DOCUMENTS

| | | | |
|---|---|---|---|
| 4,422,888 | 12/1983 | Stutius | 117/93 |
| 4,988,640 | 1/1991 | Bohling et al. | 438/488 |
| 5,018,479 | 5/1991 | Markunas et al. | |

FOREIGN PATENT DOCUMENTS 0564915 10/1993 European Pat. Off. .

OTHER PUBLICATIONS

Remote plasma enhanced CVD deposition of silicon nitride and oxide for gate insulators in (In, GA) As FET devices; P.D. Richard, R.J. Markunas, G. Lucovsky, G.G. Fountain, A.N. Mansour and D.V. Tsu; Received Oct. 12, 1984; accepted Dec. 4, 1984; pp. 867–872.
Recent Progress in Atomic Layer Epitaxy of III–V Compounds; S.M. Bedair, B.T. McDermott, Y. Ide, N.H. Karam, H. Hashemi, M.A. Tischler, M. Timmons, J.C.L. Tarn and N. El–Masry; 1988; pp. 182–189.
Molecular Beam Epitaxy: Thin Film Growth and Surface Studies; Theodore D. Moustakas; Nov. 1988; pp. 29–34.
Ultraviolet–assisted growth of GaAs; P. Balk, M. Fischer, D. Grundmann, R. Luckerath, H. Luth and W. Richter; Received Feb. 27, 1987; accepted May 27, 1987; pp. 1453–1459.
Plasma assisted chemical vapor deposited thin films for microelectronic applications; S.V. Nguyen; Received Oct. 21, 1985; accepted Jun. 6, 1986; pp. 1159–1167

(List continued on next page.)

Primary Examiner—Felisa Hiteshew
Attorney, Agent, or Firm—Antonelli, Terry, Stout & Kraus, LLP

[57] ABSTRACT

The present invention relates to a method for growing new binary, ternary and quaternary epitaxial layers of III–V compound semiconductors which have the characteristics of low temperature growth, good stability and high-purity, using remote plasma, comprising the steps of converting $H_2$ and He mixed gas into a plasma state; heating a high-purity of solid source to generate a vaporized source; reacting the vaporized source with $H_2$ under the $H_2$ and He plasma environment to produce V-hydrides in situ; introducing the V-hydrides directly into group III source without passing through the plasma; and reacting V-hydrides with group III source on a substrate to form an epitaxial thin layer of III–V compound semiconductors. According to the present invention, high-purity of epitaxial thin layer can be formed at a low temperature, an economical process that does not require an ultrahigh vacuum, a stabilized process that does not need to handle poisonous gas for the reaction with gropu V, and a simple process for manufacturing the various binary, ternary and quaternary compound semiconductor alloys can be provided. Thus, the method of the present invention can be applied to the future information and communication industry, for example, high speed, high frequency optical communication system with (Ga, In, Al)—(As, P, Sb) based on III–V compound semiconductor electronic and optical devices, and the circuitry thereof including heterojunction bipolar transistors, high electron mobility transistors, semiconductor lasers and optical switches.

6 Claims, 1 Drawing Sheet

OTHER PUBLICATIONS

Growth of GaAs and InP on Si Using Plasma Stimulated MOCVD; J. Leiber, A. Brauers, H. Heinecke, H. Luth and P. Balk; Received Dec.15, 1988; manuscript received in final form Mar. 28, 1989; pp. 483–489.

Plasma–assisted low temperature expitaxy; K.P. Pande and O. Aina; Received Aug. 21, 1985; accepted Sep. 30, 1985; pp. 673–676.

Metalorganic chemical vapor deposition of III–V semiconductors; M.J. Ludowise; Received Nov.15,1984; accepted for publication Jun. 24, 1985; pp. R31–R55.

METHOD FOR GROWING EPITAXIAL LAYERS OF III-V COMPOUND SEMICONDUCTORS

BACKGROUND OF THE INVENTION

The present invention relates to a method for growing epitaxial layers of III–V compound semiconductors, and more particularly, to a method for growing epitaxial layers of III–V compound semiconductors of new binary, ternary and quaternary alloys having the characteristics of low temperature growth, good stability and high-purity, using remote plasma.

Recently, the developing communication industry has urgently required electronic devices of ultrahigh speed and ultrahigh frequency, together with optical devices for long wavelength between 1.3 μm and 1.55 μm including ultra low loss wavelength of optical fibers.

It is well known that the above requirements can be satisfied with the devices composed of (Ga, In, Al)—(As, P, Sb) based on binary, ternary and quaternary III–V compound semiconductor alloys.

In manufacturing the compound semiconductors, various methods such as liquid phase epitaxy(LPE), vapor phase epitaxy(VPE), molecular beam epitaxy(MBE) and metalorganic chemical vapor deposition(MOCVD) are utilized. Among them, MBE and MOCVD methods are generally suitable for the above requirements. According to the MBE methods, solid sources are heated under the ultrahigh vacuum condition of $10^{-10}$ torr or below. And, the vaporized sources are deposited on a heated substrate to a low temperature of 500~600° C. The low temperature process can enable the deposition of fine atomic layers and molecular layers to be controlled easily. But, the growth rate of a desired layer is very slow and a plurality of wafers can not be processed simultaneously in a batch. Further, MBE method is disadvantageous economically because the method should be performed under ultrahigh vacuum conditions which require costly facilities.

MOCVD method has more advantages for a desired epitaxial layer to be rapidly grown and a plurality of wafers to be processed simultaneously in a batch. Further, MOCVD method is more economical. But, the group V source gases used in this method such as $AsH_3$ and $PH_3$, are fatally poisonous, thus careful attention should be given to the handling thereof.

Further still, MOCVD method requires a relatively high growth temperature in the range of 650~1000° C. depending on the sorts of materials. Thus, when the multilayer heterostructures comprising a plurality of fine layers are formed, atoms of each layer may be diffused mutually between each layer and the control of the diffusion range of the atoms in each layer is difficult.

SUMMARY OF THE INVENTION

To overcome the above-mentioned problems, it is an object of the present invention to provide a method for growing epitaxial layers of III–V compound semiconductors in which remote plasma or indirect plasma is utilized, in which the growth temperature can be lowered by the kinetic energy from plasma, and group V gases can be generated in situ within a reaction chamber.

To accomplish the above object, the present invention provides a method for growing epitaxial layers of III–V compound semiconductors, comprising the steps of:

converting $H_2$ and He mixed gas into a plasma state;

heating a high-purity of solid source to generate a vaporized source;

reacting the vaporized source with $H_2$ under the $H_2$ and He plasma environment to produce V-hydrides in situ;

introducing the V-hydrides directly into group III source without passing through the plasma; and reacting V-hydrides with group III source on the heated substrate to form an epitaxial thin layer of the III–V compound semiconductors.

BRIEF DESCRIPTION OF THE DRAWINGS

The above object and the other advantages of the present invention will become more apparent by describing in detail a preferred embodiment thereof with reference to the attached drawing in which.

DETAILED DESCRIPTION OF THE INVENTION

Figure 1:
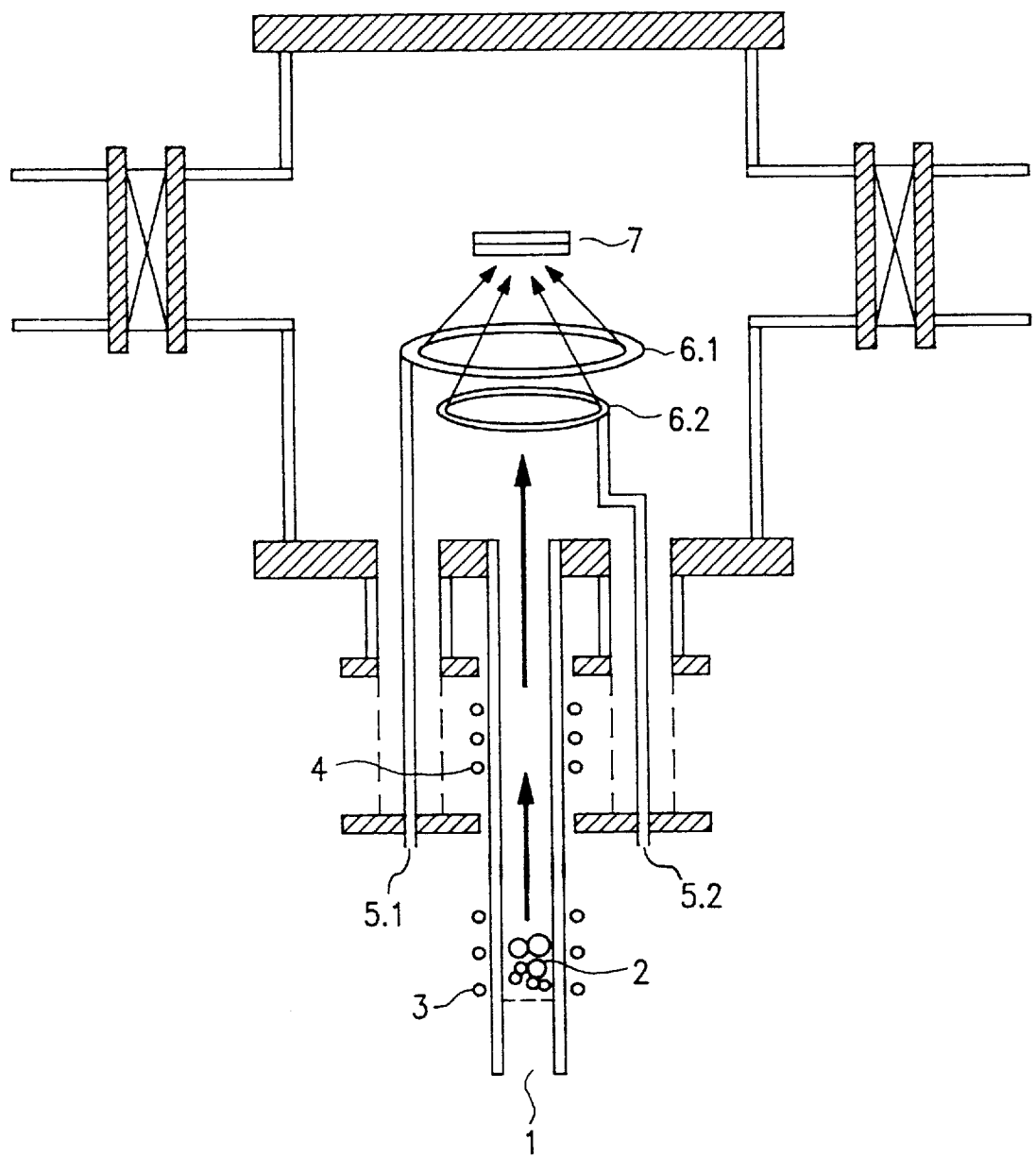
FIG. 1 is a schematic side view illustrating a method for growing epitaxial layers of III–V compound semiconductors according to the present invention.

When hydrogen($H_2$) and helium(He) are passed through the solid sources of As, P or Sb instead of the group V hydrogen compound such as $AsH_3$ or $PH_3$, group V elements react with $H_2$ under the plasma environment to generate V-hydrides in situ within the plasma generation chamber.

On the other hand, the organometallic compounds such as Ga, In or Al, which are group III source, are directly introduced into the reaction chamber and react with the V-hydrides which were generated in situ, in the substrate to form III–V compound epitaxial thin layers.

Above descriptions can be expressed as follows:

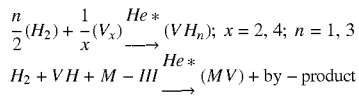

$$\frac{n}{2}(H_2) + \frac{1}{x}(V_x) \xrightarrow{He*} (VH_n); \ x = 2, 4; \ n = 1, 3$$
$$H_2 + VH + M - III \xrightarrow{He*} (MV) + by-product$$

where, Vx is a froup V element source such as Ga, In or Al, and VH is a hydrogen compound of the group V, and MV is a produced III–V compound semiconductor.

According to the present invention, vapors produced by heating group V solid sources such as As, P or Sb react with $H_2$ under the $H_2$ and He plasma environment using remote plasma to produce V-hydrides in situ.

Organometallic compounds such as Ga, In or Al, which are group III source, are directly introduced into the reaction chamber without passing through the plasma and react with the V-hydrides on the substrate to form III–V compound semiconductor epitaxial thin layers.

In the above process, the growth temperature is relatively lowered by using the energy provided by the plasma, and group V gas is produced in situ within the reaction chamber so as to keep the safety. In addition it is easy to produce compound semiconductors of various binary, ternary and quaternary alloys. Therefore, the present invention provides a new method for growing the epitaxial layer of compound semiconductors which can solve the problems of the conventional MBE or MOCVD method.

Next, a preferred embodiment of the present invention will be described in a reference to the attached drawing.

FIG.1 is a schematic side view illustrating a method for growing epitaxial layer of III–V compound semiconductors according to the present invention.

Referring to FIG.1, $H_2$ and He mixed gas 1 flows to a plasma generation chamber to make the plasma environment in the RF region. Instead of V-hydrides such as $AsH_3$, $PH_3$ or $SbH_3$, high-purity of group V solid source 2 such as As, P or Sb is placed within a crucible having a bottom mesh through which gases can be passed, and heated in a furnace 3.

The $H_2$ and He mixed gas 1 is passed continuously through group V solid source 2, and simultaneously react with $H_2$ under the (He+$H_2$) plasma environment 4 in the RF region to produce V-hydrides in situ.

Meanwhile, a group III source such as Ga, In or Al is converted into a vaporized source by heating the liquid or solid state of organometallic compound, then introduced into a reaction chamber 5.1 and 5.2 without passing through the plasma environment, in order to lead to the organometallic source rings 6.1 and 6.2. Accordingly, various reaction pathways which may occurred in the gas passages can be reduced.

As a result, V-hydrides produced in situ under the He plasma environment can react with group III element gases injected from the ring on a substrate 7, to produce high purity III–V compound semiconductors.

In the above process, a high quality of epitaxial thin layer can be obtained even at a low substrate temperature of 500° C. or less, by using the energy from the plasma. Further, a background vacuum of $10^{-7}$~$10^{-8}$ torr is maintained. Actual reactions occur at about 1 torr.

Accordingly, if the remote plasma chemical vapor deposition is applied according to the present invention, high-purity epitaxial thin layer can be formed at a low temperature, and an economical process that does not require an ultrahigh vacuum, a stabilized process that does not need to handle the fatally poisonous group V gases, and a simple process for manufacturing the compound semiconductors of the various binary, ternary and quaternary alloys can be provided. Thus, the method of the present invention can be applied to the applied communication industry, for example, high speed, high frequency optical communication system with (Ga, In, Al)—(As, P, Sb) based on III–V compound semiconductor electronic and, optical devices and the circuitry thereof, including heterojunction bipolar transistors, high electron mobility transistors, semiconductor lasers and optical switches.

What is claimed is:

1. A method for growing an epitaxial layer of III–V compound semiconductors, said method comprising the steps of:

converting $H_2$ and He mixed gas into a plasma state;

heating a high-purity solid source to generate a vaporized source;

reacting the vaporized source with $H_2$ under the $H_2$ and He plasma state to produce V-hydrides in situ;

introducing the V-hydrides directly into a group III source without passing through plasma; and reacting V-hydrides with the group III source on the substrate to form an epitaxial thin layer of III–V compound semiconductors.

2. The method of claim 1, wherein the step of introducing the V-hydrides into the group III source includes the step of supplying organometallic compound as a vapor source.

3. The method of claim 1, wherein the step of heating a solid source includes using at least one of arsenic, phosphorus and antimony.

4. The method of claim 1, wherein the step of introducing the V-hydrides into the III group source is performed at a substrate temperature between 400~600° C.

5. The method of claim 1, wherein the step of introducing the V-hydrides into the III group source is performed at a background vacuum maintained in a range of $10^{-9}$~$10^{-6}$ torr.

6. The method of claim 1, wherein the step of introducing the V-hydrides into the III group source is performed at a pressure in a range of 0.5~25 torr.

* * * * *